(12) United States Patent
Lin et al.

(10) Patent No.: US 8,619,488 B2
(45) Date of Patent: *Dec. 31, 2013

(54) MULTI-LEVEL ELECTRICAL FUSE USING ONE PROGRAMMING DEVICE

(75) Inventors: Yung-Lung Lin, Taichung (TW); Jui-Jen Wu, Hsinchu (TW); Shine Chung, Taipei Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/492,635

(22) Filed: Jun. 8, 2012

(65) Prior Publication Data

US 2012/0243290 A1    Sep. 27, 2012

Related U.S. Application Data

(63) Continuation of application No. 11/715,631, filed on Mar. 8, 2007, now Pat. No. 8,223,575.

(51) Int. Cl.
*G11C 17/18* (2006.01)
*G11C 17/14* (2006.01)
*G11C 17/16* (2006.01)
*G11C 17/00* (2006.01)

(52) U.S. Cl.
USPC ............... 365/225.7; 365/96; 365/189.16; 327/525

(58) Field of Classification Search
USPC ............ 365/200, 225.7, 96, 189.16; 327/525
See application file for complete search history.

(56) References Cited

U.S. PATENT DOCUMENTS

| | | | | |
|---|---|---|---|---|
| 5,635,854 | A * | 6/1997 | Shimanek et al. | 326/38 |
| 5,661,323 | A * | 8/1997 | Choi et al. | 257/378 |
| 5,661,685 | A * | 8/1997 | Lee et al. | 365/185.22 |
| 6,185,705 | B1 * | 2/2001 | Cutter et al. | 714/721 |
| 6,242,790 | B1 * | 6/2001 | Tsui et al. | 257/529 |
| 6,373,771 | B1 * | 4/2002 | Fifield et al. | 365/225.7 |
| 6,999,333 | B2 * | 2/2006 | Janke | 365/94 |
| 2005/0052892 | A1 * | 3/2005 | Low et al. | 365/94 |
| 2005/0151578 | A1 * | 7/2005 | Huang et al. | 327/525 |
| 2005/0270085 | A1 * | 12/2005 | Illegems | 327/525 |
| 2006/0152990 | A1 * | 7/2006 | Huang | 365/225.7 |

* cited by examiner

*Primary Examiner* — J. H. Hur
(74) *Attorney, Agent, or Firm* — K&L Gates LLP

(57) ABSTRACT

A method for programming a multi-level electrical fuse system comprises providing a fuse box with an electrical fuse and providing one of at least two fuse writing voltages to the electrical fuse to program the electrical fuse to one of at least two resistance states. The fuse box comprises at least one electrical fuse, a programming device serially coupled to the electrical fuse, and a variable power supply coupled to the fuse box and configured to generate two or more voltage levels.

19 Claims, 4 Drawing Sheets

MULTI-LEVEL ELECTRICAL FUSE USING ONE PROGRAMMING DEVICE

BACKGROUND

This application is a Continuation Application of U.S. application Ser. No. 11/715,631, filed on Mar. 8, 2007, entitled: MULTI-LEVEL ELECTRICAL FUSE USING ONE PROGRAMMING DEVICE, now pending.

The present invention relates generally to an integrated circuit (IC) design, and more particularly to a system of circuit designs used for programming an electrical fuse using only one programming device, and a method for programming a multi-level electrical fuse system.

Electrical fuses are often utilized for modern semiconductors for making adjustments and repairs that are performed as late as after a semiconductor chip is packaged. They are designed to be blown when a current through the fuses exceeds a predetermined threshold, thus causing energy build-up that in turn blows the fuses. By blowing a fuse during programming, nonvolatile data storage can be provided. Electrical fuses can be flexibly positioned even in the most complex semiconductor designs, since wirings are allowed above and below the fuses, thereby making electrical fuses a desirable component for higher density memory devices.

A conventional system used for the programming of electrical fuses is designed to only program two-state fuses that can only provide one of the two states: "1" or a "0". As such, it is difficult to achieve high data volume, such as 64 k-bits or more since there will be a very high bit count that requires a large number of electrical fuses. As the bit count reaches an even higher number, the probability that the semiconductor circuit may malfunction due to a bit malfunctioning increase, thereby reducing overall yield. To improve the efficiency of electrical fuses, multi-level electrical fuses that can be programmed into one of three states have been used recently. These multi-level electrical fuses can increase in density and can be implemented in a smaller effective area. For example, by using 10 cells, a three-state electrical fuse system can yield 3^10 or 59,049 data options, while a two-state electrical fuse system can only yield 2^10 or 1,024 data options. However, the original design for a multi-level electrical fuse circuit requires an additional programming device in order to program the multi-level fuse properly. This additional programming device is a penalty that space-conscious semiconductor designers can ill afford.

Desirable in the art of integrated circuit designs is a new multi-level electrical fuse system that achieves a higher data volume without resorting to larger bit count and increasing the number of programming devices.

SUMMARY

In view of the foregoing, this invention provides a multi-level electrical fuse system and a method for programming an electrical fuse into one of multiple states in a multi-level electrical fuse system. The method comprising: providing at least one fuse box including at least one electrical fuse; and providing one of multiple fuse writing voltages to the electrical fuse to program the fuse to one of multiple resistance states, the at least one fuse box further comprises a programming device serially coupled to the electrical fuse and a variable power supply coupled to the fuse box and configured to generate two or more voltage levels.

In another embodiment, a method for programming an electrical fuse into one of multiple states in a multi-level electrical fuse system is disclosed. The method comprises: providing at least one electrical fuse; and providing one of multiple fuse writing voltages to the electrical fuse to program the fuse to one of multiple resistance states. The multi-level fuse electrical fuse system includes the electrical fuse, a programming device serially coupled to the electrical fuse, and a fuse writing circuit having a comparator having a first input coupled to the fuse box and a second input coupled to a controllable state reference circuit, wherein when the first input voltage is higher than the second input voltage, the comparator outputs a first logic state and when the first input voltage is lower than the second input voltage, the comparator outputs a second logic state complementary to the first logic state, and a control circuit coupled between an output of the comparator and the programming device.

The construction and method of operation of the invention, however, together with additional objects and advantages thereof will be best understood from the following description of specific embodiments when read in connection with the accompanying drawings.

DESCRIPTION

The following will provide a detailed description of a system for programming an electrical fuse at multiple levels using only one programming device.

Figure 1A:
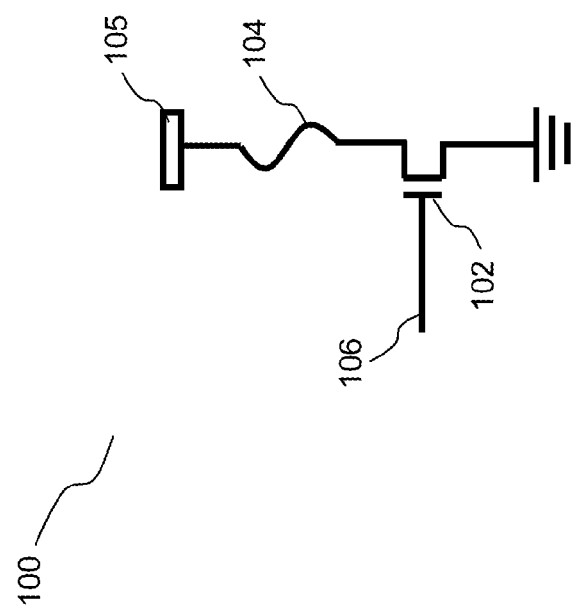
FIG. 1A is a schematic diagram illustrating a conventional two-level electrical fuse circuit with a programming device.

FIG. 1A illustrates a circuit diagram 100 showing a conventional system for programming electrical fuses with a programming device. The programming device is typically a NMOS type programming device or a PMOS type programming device. In the circuit diagram 100, an NMOS type programming device 102 is coupled with an electrical fuse 104, which is placed between the NMOS type program device 102 and a power supply source 105. Control signals will enter through a select line 106 when the electrical fuse 104 is assigned to be programmed. The NMOS or PMOS type programming device used for programming an electrical fuse is designed to be large in physical size since a large current is typically required to program electrical fuses such as the electrical fuse 104.

However, this conventional system is designed to only program two-state fuses that can only provide one of the two states: a "1" or a "0". As such, it is difficult to achieve a higher data volume, such as 64 k-bits or more, since there will be a very high bit count requiring a large number of electrical fuses.

Figure 1B:
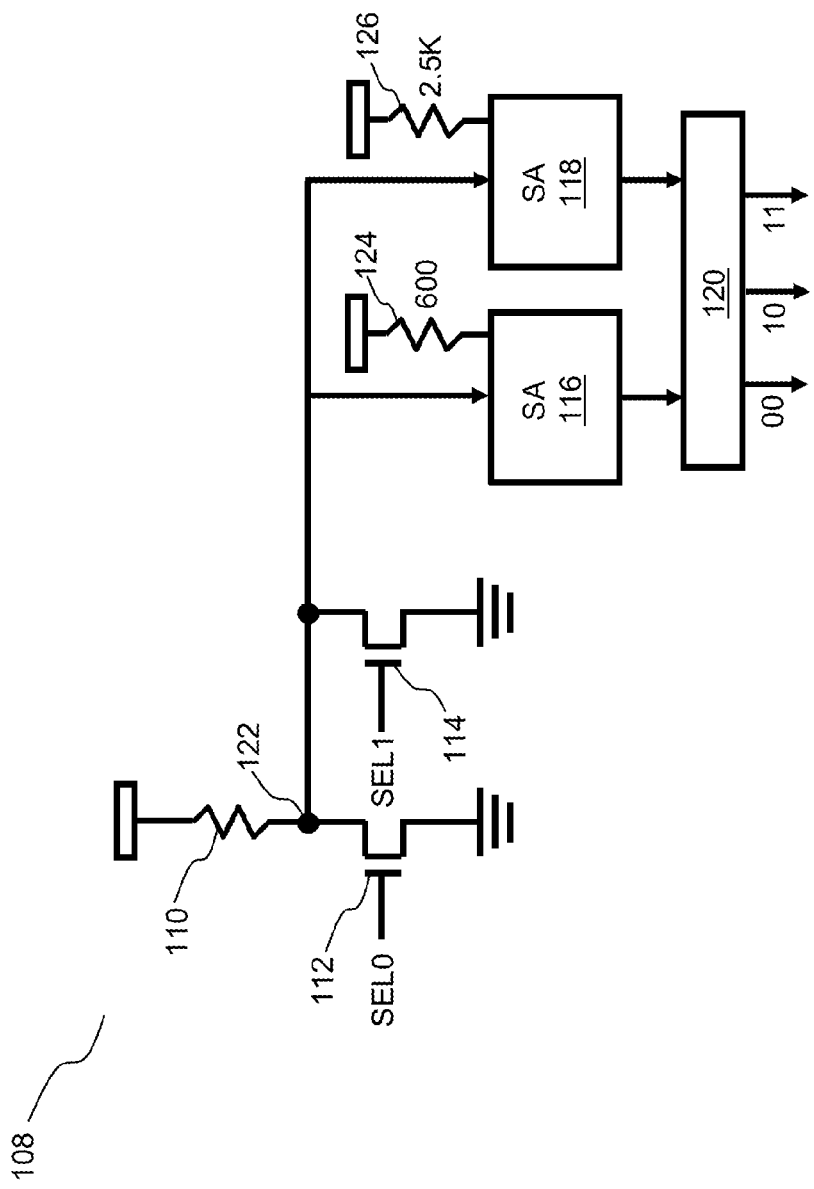
FIG. 1B is a schematic diagram illustrating a conventional multi-level electrical fuse circuit with programming and reading circuits.

FIG. 1B illustrates a circuit diagram of a conventional multi-level electrical fuse circuit 108 where an electrical fuse can be programmed by one of two programming devices in order to increase a high data volume without the need for high bit counts. The multi-level electrical fuse circuit 108 comprises an electrical fuse 110, a small programming device 112, a large programming device 114, two sense amplifiers 116 and 118, and a logic device 120. The electrical fuse 110 is designed to be programmed into one of three possible states, or levels. The state of the electrical fuse 110 is determined by the resistance of the electrical fuse 110. In order to program the electrical fuse 110, the small programming device 112 and the large programming device 114 are coupled to the electrical fuse 110 at a node 122. The small programming device 112 is designed to program the electrical fuse 110 by slightly blowing the electrical fuse 110, thus leaving it in a state with a lower resistance while the large programming device 114 is designed to program the electrical fuse 110 by applying a larger current to flow to the fuse, thus leaving it in a state with a higher resistance. By having these two programmed resistance states and a non-programmed state, the electrical fuse 110 can be programmed with one of the three states.

The sense amplifiers 116 and 118 are also coupled to the node 122 to detect the resistance state of the electrical fuse 110 for a reading process. The sense amplifiers 116 and 118 are coupled to reference resistors 124 and 126, respectively. In this example, the reference resistor 124 is a 600-ohm resistor and the reference resistor 126 is a 2.5 k-ohm resistor. By comparing the resistance of the electrical fuse 110 with the resistance of the reference resistors 124 and 126, the sense amplifiers 116 and 118 can determine the resistance state of the electrical fuse 110. The output of the sense amplifiers 116 and 118 is received by the logic device 120 where a binary output of the state of the electrical fuse 110 is provided.

With this system, an electrical fuse can be programmed to be one of the multiple states, or levels, thus allowing a device to achieve a high data volume without a high number of bit counts. However, the need for both the small programming device 112 and the large programming device 114 greatly increases the area necessary for implementing this conventional multi-level electrical fuse circuit 108.

Figure 2:
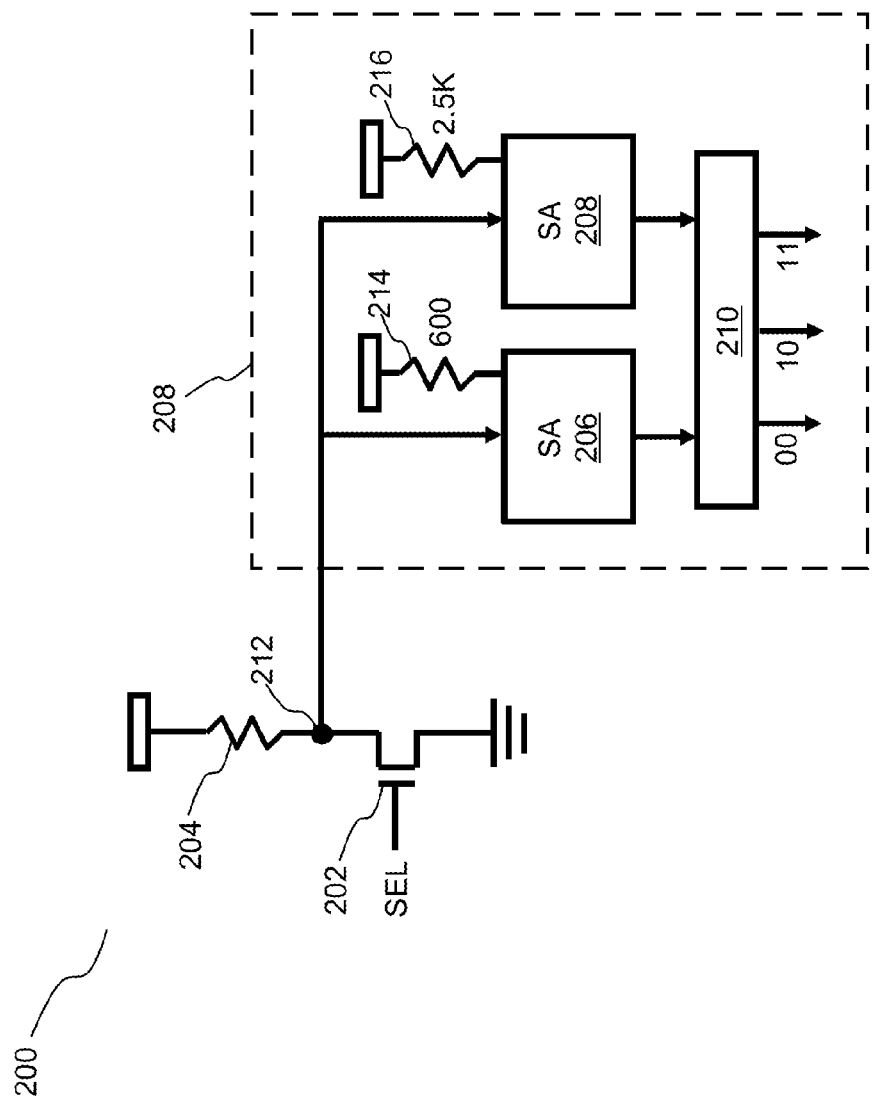
FIG. 2 is a schematic diagram illustrating a multi-level electrical fuse circuit with a reading circuit in accordance with one embodiment of the present invention.

FIG. 2 is a schematic diagram illustrating a multi-level electrical fuse circuit 200 with a reading circuit 208 in accordance with one embodiment of the present invention. The multi-level electrical fuse circuit 200 comprises the programming device 202, the electrical fuse 204 and the reading circuit 208. The reading circuit may be implemented as two sense amplifiers 206 and 208, and a logic device 210. The electrical fuse 204 is designed to be programmable into one of three possible states using only one programming device 202. The state of the electrical fuse 204 is determined by the resistance of the electrical fuse 204. Unlike the conventional multi-level electrical fuse circuit 100 shown in FIG. 1B, the electrical fuse 204 is designed to be programmable into one of the three states based on the different levels of voltage applied to the electrical fuse 204 during a programming process. By contrast, the multi-level electrical fuse circuit 200 is similar to the circuit diagram 100 in FIG. 1A in that the electrical fuse in both is programmed using only one programming device coupled with the electrical fuse. A lower level of voltage applied to the electrical fuse 204 can program the electrical fuse 204 by slightly blowing the fuse, thus leaving it in a state with a lower resistance while a higher level of voltage applied to the electrical fuse 204 can further blow the fuse, thus leaving it in a state with a higher resistance. By having these two programmed resistance states and a non-programmed state, the electrical fuse 204 can be programmed with one of the three states.

The sense amplifiers 206 and 208 are coupled to a node 212 in order to detect the resistance state of the electrical fuse 204 during a reading process. The sense amplifiers 206 and 208 are respectively coupled to reference resistors 214 and 216. In this example, the reference resistor 214 is a 600-ohm resistor and the reference resistor 216 is a 2.5 k-ohm resistor. By comparing the resistance of the electrical fuse 204 with the resistances of the reference resistors 214 and 216, the sense amplifiers 206 and 208 can determine the resistance state of the electrical fuse 204. The output of the sense amplifiers 206 and 208 are received by the logic device 210 where a binary output of the state of the electrical fuse 204 is provided.

By implementing only one programming device 202, the effective cell size can be reduced while keeping the same area necessary for the traditional fuse structure. In a preferred embodiment, an effective 58% increase in bit capacity, given a similar semiconductor footprint, may be achieved. In this scenario, an estimate 1-to-3 ratio between fuse area and programming device area is achieved. Also, resistance distribution is reduced due to the simplicity of the design. Furthermore, the interface to control programming is also reduced because only one, not two, programming device needs to be controlled.

Figure 3:
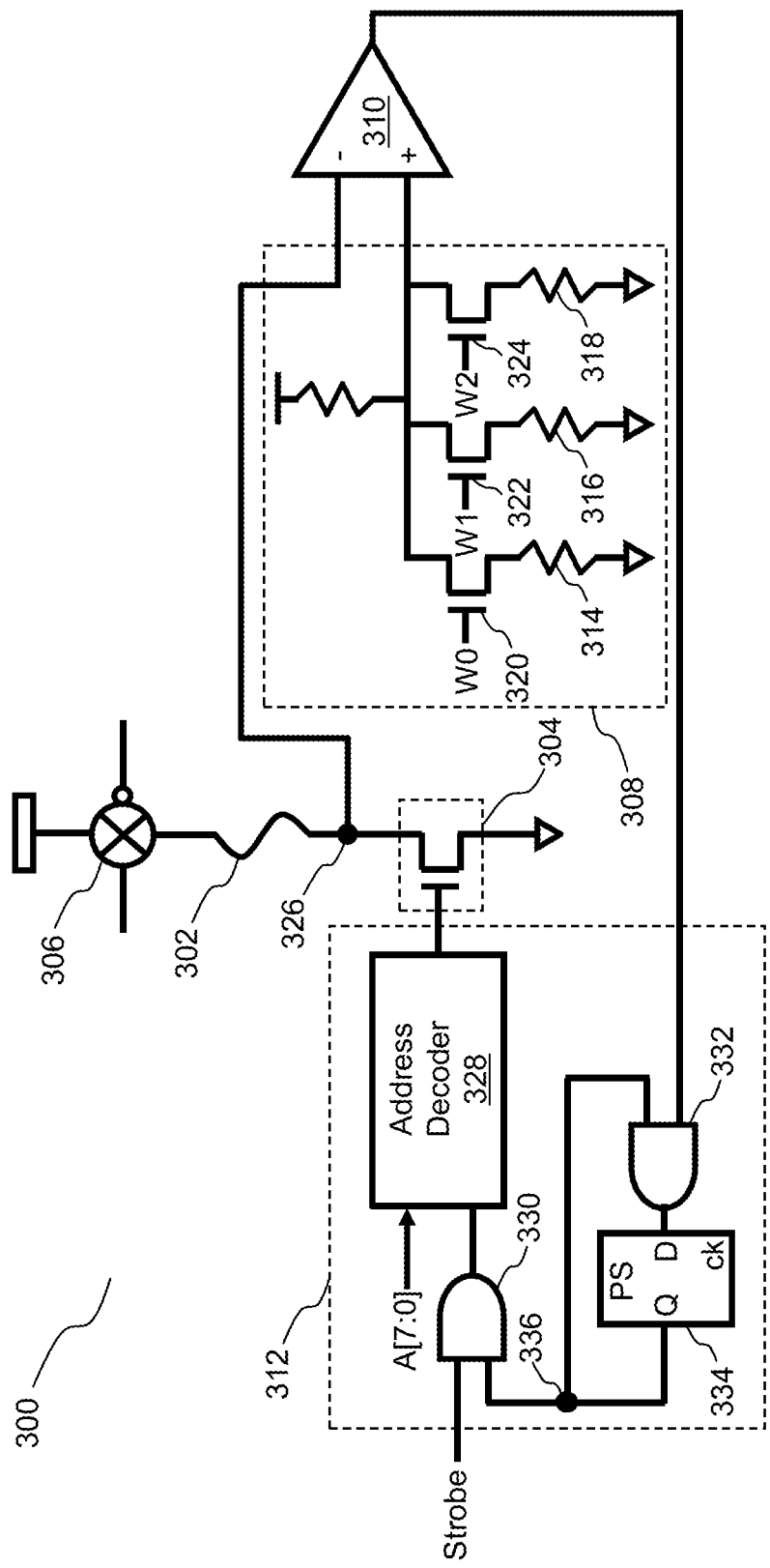
FIG. 3 is a schematic diagram illustrating a multi-level electrical fuse circuit with a fuse writing circuit in accordance, the embodiment of the present invention.

FIG. 3 is a schematic diagram illustrating a multi-level electrical fuse circuit 300 with a fuse writing circuit in accordance with the embodiment of the present invention. The multi-level electrical fuse circuit 300 comprises an electrical fuse 302, a programming device 304, a voltage regulator 306, a state reference circuit 308, a comparator 310, and a control circuit 312. The electrical fuse 302 may be a silicide poly fuse, a non-volatile fuse, or a contact fuse. The programming device 304 may be implemented as a NMOS transistor as shown in FIG. 3. In this case, the NMOS programming device 304 is coupled with the electrical fuse 302 through its drain while its source is coupled to the ground. Note that it is also possible for a PMOS transistor to be used as the programming device 304 without deviating from the spirit of this invention. In the case wherein the programming device 304 is a PMOS transistor, the circuit 300 is modified such that the source of the PMOS transistor is coupled with the voltage regulator while the drain is coupled with one end of the electrical fuse 302. The voltage regulator 306, which is shown as a multiplexer and acts as a voltage selection device, is designed to provide the electrical fuse 302 with a desired voltage level during a fuse writing process. For example, if the electrical fuse 302 is to be programmed to have a higher resistance state, the multiplexer 306 will provide a higher level of fuse writing voltage, and if the electrical fuse 302 is to be programmed to a lower resistance state, the multiplexer 306 will provide a lower level of fuse writing voltage. One of the multiple fuse writing voltages can be provided to the electrical fuse via the multiplexer 306 to program the fuse to one of the multiple resistance states.

The state reference circuit 308, used for providing a reference voltage to the comparator 310 during a fuse writing process, can produce at least two predetermined reference states that may be generated by a resistive voltage divider. In this example, the state reference circuit 308 comprises three reference resistors 314, 316, and 318, which are respectively coupled with resistance selectors 320, 322 and 324. For this example, the reference resistor 314 is a 500-ohm resistor, the reference resistor 316 is a 1 k-ohm resistor, and the reference resistor 318 is a 1.5 k-ohm resistor. The resistance selectors 320, 322, and 324, shown as NMOS pass-gate transistors, are controlled by a logic device, not shown in this figure, and can be turned on and off to adjust the reference resistance which in turn affects the reference voltage provided to the comparator 310. The resistance state of the state reference circuit 308 can be calculated by converting the state of the resistance of the electrical fuse 302 in a fixed time duration. For example, if the initial state is $10^X +/- 10\%$ ohm, the first state is about $10^{2X} +/- 10\%$ ohm, and the second state is about $10^{3X} +/- 10\%$ ohm. With the reference resistors 314, 316, and 318 in this example, multiple reference resistance states can be achieved. Using the values provided in this example, the first reference resistance state may be about 480 ohms to about 520 ohms at a ramping program voltage of about 0.8V to about 1.2V. A second reference resistance state ranges from about 960 ohms to about 1,040 ohms at a ramping program voltage of about 1.1V to about 1.4V, and a third reference resistance state ranges from about 1,200 ohms to about 1,300 ohms at about 1.3V to 1.6V. With this information, a reference voltage can be used for comparison with the fuse voltage in the comparator 310 to determine the state of the electrical fuse 302.

The comparator 310, which has two input terminals, is designed to compare the states of the electrical fuse 302 with the states of the state reference circuit 308. This can be done by comparing the fuse voltage at a node 326 with the reference voltage provided by the state reference circuit 308. Note that the fuse voltage at the node 326 is dependent on the resistance state of the electrical fuse 302. After the comparison, the output signal from the comparator 310 is then provided to the control circuit 312 which controls the programming device 304. An output signal "1" would represent the case in which the reference voltage is higher than the fuse voltage, and an output signal "0" would represent the case where the reference voltage is lower than the fuse voltage.

The control circuit 312, comprising an address decoder 328, two AND-gates 330 and 332, and a flip-flop 334, is designed to turn off the programming device 304 when the comparator output signal reaches a predetermined state. Initially, the output of the flip-flip 334 is pre-set to "1" thus allowing the AND-gate 330 to turn on the address decoder 328 as well as the programming device 304 when the strobe signal is switched high. The addressing information is also provided as an input for the address decoder 328. During a write operation, the AND-gate 332, with one input terminal connected to a node 336 and another input terminal connected to the output of the comparator 310, continuously receives the output signals from the comparator 310. If the fuse voltage is less than the reference voltage, a "1" is outputted from the comparator 310, thus allowing the AND-gate 332 to output a high signal to the flip-flop 334 and keeping the output of the flip-flop 334 high at "1". This allows the control circuit 312 to remain in the same condition and keeps the programming device 304 turned on. If the fuse voltage is greater than the reference voltage, a "0" is outputted from the comparator 310, thus causing the AND-gate 332 to output a low signal and allowing the output of the flip-flop 334 to switch low to "0" when a clock signal CK is initiated during the next clock cycle. This will result in the AND-gate 330 to output a low signal, thus turning off the address decoder 328 as well as the programming device 304. With the flip-flop 334 switched to output a low signal, the node 336 is latched to a low state and cannot be switched back to high state even if the comparator 310 outputs a high signal. Then the fuse writing process is completed with the resistance of the fuse 302 reaching a target value, which is determined by the reference circuit 308. Changing power supply voltage can certainly affect the resistance increasing rate of the electrical fuse 302, allowing for longer time under a certain power supply voltage, which can also increase the resistance of the electrical fuse to the same desired level. No matter if it is changing voltage or changing time, once a target resistance is reached, the reference circuit 308 will inform the control circuit 312 to turn off the programming device 304, hence stop the progressing process, so that the resistance of the fuse 304 can stay at the desired level.

In an example scenario where the electrical fuse 302 is to be programmed, the strobe signal provided for the AND-gate 330 of the control circuit will be switched high. The flip-flop 334 is pre-set to output "1" initially, thus allowing the AND-gate 330 to output a high signal that turns on the address decoder 328. The address decoder 328 then uses the given address information to select the programming device 304 by providing a high signal to the NMOS transistor within. A desired level of voltage will be selected by the multiplexer 306 to program the electrical fuse 302. During writing of the electrical fuse 302, the comparator 310 will compare the fuse voltage at the node 326 with a predetermined reference voltage provided by the state reference circuit 308. Once the resistance of the electrical fuse 302 is programmed to a desired level, the fuse voltage should be greater than the reference voltage, and a low signal "0" should be outputted by the comparator 310. This will cause both the AND-gate 332 and the flip-flop 334 to output a low signal, thereby causing the node 336 to latch onto a low signal. With the node 336 latched onto a low signal, the programming device 304 will be turned off, thus stopping the fuse writing process, so that a targeted resistance of the fuse 302 has been reached.

The electrical fuse within the proposed multi-level electrical fuse circuit is designed to be connected to one programming device and an input voltage provided by a voltage selection device or a voltage regulator that is predefined with a different resistance value. By implementing an adjustable supply voltage for the electrical fuse, only one programming device is necessary for writing a multi-level electrical fuse, thus reducing the effective cell size. The data programmed at an electrical fuse is converted into a voltage at a level corresponding to the resistance of the electrical fuse. This voltage is compared at a comparator with a reference voltage provided by a state reference circuit to determine if the electrical fuse has been programmed. The comparison result may also read out as a high or low signal during a read operation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for programming an electrical fuse into one of multiple states in a multi-level electrical fuse system, comprising:
  providing at least one electrical fuse; and
  providing one of multiple fuse writing voltages to the electrical fuse to program the at least one electrical fuse to one of multiple resistance states, the multi-level electrical fuse system further comprising:
  a programming device serially coupled to the electrical fuse;
  a variable power supply coupled to electrical fuse through a multiplexer and configured to generate three or more voltage levels so that the electrical fuse can be programmed into one of three or more states;
  a comparator having a first input coupled to the fuse box and a second input coupled to a controllable state reference circuit; and a control circuit for turning on or off the programming device in response to an output signal from the comparator, including:
a first AND gate coupled between the comparator and a flip-flop; a second AND gate receiving a strobe signal and an output signal from the flip-flop; and
an address decoder receiving an address signal and an output signal from the second AND gate for turning on or off the programming device.

2. The method of claim 1, wherein the electrical fuse is selected from the group consisting of a silicide polysilicon fuse, a non-volatile fuse and a contact fuse.

3. The method of claim 1, wherein
the programming device comprises a NMOS transistor having a gate, a source and a drain coupled to a programming selection signal, a GND and a first terminal of the fuse, respectively; and
a second terminal of the fuse is coupled to the variable power supply.

4. The method of claim 1, wherein
the programming device comprises a PMOS transistor having a gate, a source and a drain coupled to a programming selection signal, the variable power supply and a first terminal of the fuse, respectively; and
a second terminal of the fuse is coupled to the GND.

5. The method of claim 1, wherein the controllable state reference circuit comprises a controllable resistive voltage divider generating two or more voltage levels corresponding to two or more variations of resistances of the voltage divider.

6. The method of claim 1, wherein the control circuit comprises a flip-flop for latching a first logic state which is used to shut off the programming device.

7. A method for programming an electrical fuse into one of multiple states in a multi-level electrical fuse system, comprising:
providing at least one fuse box including at least one electrical fuse; and
providing one of multiple fuse writing voltages to the fuse box to program the electrical fuse to one of multiple resistance states, the multi-level electrical fuse system further comprising:
a variable power supply coupled to the fuse box through a multiplexer and configured to generate three or more voltage levels so that the electrical fuse can be programmed into one of three or more states;
a programming device serially coupled to the electrical fuse; and
a fuse writing circuit having:
a comparator having a first input coupled to the fuse box and a second input coupled to a controllable state reference circuit, wherein when the first input voltage is higher than the second input voltage, the comparator outputs a first logic state and when the first input voltage is lower than the second input voltage, the comparator outputs a second logic state complementary to the first logic state; and
a control circuit coupled between an output of the comparator and the programming device for turning on or off the programming device in response to an output signal from the comparator, the control circuit including:
a first AND gate coupled between the comparator and a flip-flop;
a second AND gate receiving a strobe signal and an output signal from the flip-flop; and
an address decoder receiving an address signal and an output signal from the second AND gate for turning on or off the programming device.

8. The method of claim 7, wherein the electrical fuse is selected from the group consisting of a silicide polysilicon fuse, a non-volatile fuse and a contact fuse.

9. The method of claim 7, wherein
the programming device comprises a NMOS transistor having a gate, a source and a drain coupled to a programming selection signal, a GND and a first terminal of the fuse, respectively; and
a second terminal of the fuse is coupled to a positive high voltage power supply (Vdd).

10. The method of claim 7, wherein
the programming device comprises a PMOS transistor having a gate, a source and a drain coupled to a programming selection signal, the Vdd and a first terminal of the fuse, respectively; and
a second terminal of the fuse is coupled to the GND.

11. The method of claim 7, wherein the variable power supply is configured to generate three different voltage levels.

12. The method of claim 7, wherein the controllable state reference circuit comprises a controllable resistive voltage divider generating two or more voltage levels corresponding to two or more variations of resistances of the voltage divider.

13. The method of claim 7, wherein the control circuit comprises a flip-flop for latching the first logic state which is used to shut off the programming device.

14. A method for programming an electrical fuse into one of multiple states in a multi-level electrical fuse system, comprising:
providing at least one fuse box including at least one electrical fuse; and
providing one of multiple fuse writing voltages to the electrical fuse to program the electrical fuse to one of multiple resistance states, the multi-level electrical fuse system further comprising:
a variable power supply coupled to the fuse box through a multiplexer to provide the electrical fuse with a desired voltage level during a fuse writing process and configured to generate three or more voltage levels so that the electrical fuse can be programmed into one of three or more states;
a programming device serially coupled to the electrical fuse;
a fuse writing circuit having:
a comparator having a first input coupled to the fuse box and a second input coupled to a controllable state reference circuit, wherein when the first input voltage is higher than the second input voltage, the comparator outputs a first logic state and when the first input voltage is lower than the second input voltage, the comparator outputs a second logic state complementary to the first logic state; and
a control circuit coupled between an output of the comparator and the programming device for turning on or off the programming device in response to an output signal from the comparator, the control circuit including:
a first AND gate coupled between the comparator and a flip-flop;
a second AND gate receiving a strobe signal and an output signal from the flip-flop; and
an address decoder receiving an address signal and an output signal from the second AND gate for turning on or off the programming device.

15. The method of claim 14, wherein the electrical fuse is selected from the group consisting of a silicide polysilicon fuse, a non-volatile fuse and a contact fuse.

16. The method of claim 14, wherein
the programming device comprises a NMOS transistor having a gate, a source and a drain coupled to a programming selection signal, a GND and a first terminal of the fuse, respectively; and
a second terminal of the fuse is coupled to the variable power supply.

17. The method of claim 14, wherein
the programming device comprises a PMOS transistor having a gate, a source and a drain coupled to a programming selection signal, the Vdd and a first terminal of the fuse, respectively; and
a second terminal of the fuse is coupled to the GND.

18. The method of claim 14, wherein the controllable state reference circuit comprises a controllable resistive voltage divider generating two or more voltage levels corresponding to two or more variations of resistances of the voltage divider.

19. The method of claim 14, wherein the control circuit comprises a flip-flop for latching the first logic state, which is used to shut off the programming device.

* * * * *